United States Patent
Hoshizaki et al.

(10) Patent No.: US 6,323,426 B1
(45) Date of Patent: Nov. 27, 2001

(54) MOUNTING STRUCTURE FOR SEMICONDUCTOR DEVICE

(75) Inventors: Hiroki Hoshizaki; Masashi Fuse, both of Nisshin (JP)

(73) Assignee: Advanced Mobile Telecommunication Technology Inc., Nisshin (JP)

( * ) Notice: Subject to any disclaimer, the term of this patent is extended or adjusted under 35 U.S.C. 154(b) by 0 days.

(21) Appl. No.: 09/222,313

(22) Filed: Dec. 29, 1998

(30) Foreign Application Priority Data

Jan. 14, 1998 (JP) .................................................. 10-005685

(51) Int. Cl.$^7$ .................................................. H01D 12/00
(52) U.S. Cl. ..................... 174/70 R; 174/125.1; 257/661; 257/700; 257/726; 505/220
(58) Field of Search .............................. 174/70 R, 125.1; 505/191, 220, 726; 257/661, 700, 726

(56) References Cited

U.S. PATENT DOCUMENTS 5,057,877 * 10/1991 Briley et al. .......................... 505/191
5,936,401 * 8/1999 Drehman ............................... 505/726
6,108,214 * 8/2000 Fuse .................................... 174/125.1

* cited by examiner

Primary Examiner—Albert W. Paladini
(74) Attorney, Agent, or Firm—Venable; Richard L. Aitken

(57) ABSTRACT

A mounting structure for a high temperature superconductor device, such as a filter, housed in a closed vacuum chamber and operated at a low temperature. The filter has dielectric substrate having: first and second surfaces; a circuit portion made of a superconducting thin film formed on the first surface of the dielectric substrate; and a ground layer consisting of a superconducting thin film formed on second surface of the dielectric substrate and a metal film deposited on the superconducting thin film. The mounting structure comprises: a device holder for holding the filter thereon; a conductive layer intervening between the ground layer of the filter and the device holder; urging parts for resiliently urging the filter toward the device holder. The conductive layer is made of a metal selected from among the group consisting of gold, silver, copper, aluminum and an alloy made of at least one of gold, silver, copper, and aluminum.

The mounting structure can securely ground the ground layer of the filter enough to have an extremely low contact resistance as well as can have the amount of the released gas restricted.

12 Claims, 10 Drawing Sheets

MOUNTING STRUCTURE FOR SEMICONDUCTOR DEVICE

BACKGROUND OF THE INVENTION

1. Field of the Invention

The present invention relates to a mounting structure for a superconductor device, and more particularly to a mounting structure for a high temperature superconductor device housed in a closed vacuum chamber and operated at a low temperature.

2. Description of the Related Art

There have so far been proposed a wide variety of superconductor devices, especially high temperature superconductor (hereinlater referred to simply as "HTS") devices, preferably utilized for an integrated circuit, a filter, an amplifier and so forth. This type of superconductor device generally comprises a dielectric substrate and superconducting thin film layers deposited on both of surfaces of the dielectric substrate by a physical vapor deposition method, e.g., a sputtering method or a reactive vapor deposition method. Each of the superconducting thin film layers is made of a ceramics system, such as an yttrium, barium, and copper oxide system (hereinlater referred to simply as a "YBaCuO system") of the HTS.

The superconductor has an extremely low electric resistance below a critical temperature thereby causing superconductive phenomena. The superconductor has therefore an advantage over a normal metal conductor in reducing transmission loss of signals.

Typical superconductor device is however required to be housed in a closed vacuum chamber at a low pressure of $2 \times 10^{-2}$ Pa or less and cooled at a low temperature of 80 K in order to cause the aforesaid superconductive phenomena. The superconductor device should therefore be contained in a device holding apparatus 1 as shown in FIG. 13 to keep the above pressure and temperature.

As shown in FIG. 13, the device holding apparatus 1 comprises a housing 2 formed with a closed vacuum chamber and a cooling device 3. The cooling device 3 has a cold head 3a for placing the superconductor device 4 thereon and a cold finger 3b for holding the cold head 3a at a predetermined low temperature to cool the superconductor device 4. The superconductor device 4 and the cooling device 3 are housed in the closed vacuum chamber. The cold finger 3b may comprise a coolant reservoir (not shown) for reserving a liquid helium or a liquid nitrogen, or another type of cooling device (not shown), such as a Stirling cycle cooler or a pulse tube type of cooler.

The device holding apparatus 1 further comprises an input connector 5 electrically connected to the superconductor device 4 through a signal inputting line 5a and an output connector 6 electrically connected to the superconductor device 4 through a signal outputting line 6a. The input and output connectors 5 and 6 are further electrically connected to external devices (not shown) outside of the device holding apparatus 1. The superconductor device 4 can thus transmit a signal from and to the external devices through the input and output connectors 5 and 6.

Referring to FIGS. 14 and 15 of the drawings, there is shown a conventional mounting structure 90 for the superconductor device 4 shown in FIG. 13. In this example, the superconductor device 4 is a planer band-pass filter 91. The filter 91 is adapted to have a signal inputted from a first external device (not shown in the drawings) to output a second external device (not shown).

In this example, the filter 91 comprises a dielectric substrate 92 having first and second surfaces 92a and 92b diametrically opposite to each other. The first surface 92a of the dielectric substrate 92 is shown in FIG. 15 as being an upper side surface, while the second surface 92b of the dielectric substrate 92 is shown in FIG. 15 as being a lower side surface. The dielectric substrate 92 is made of a MgO.

The filter 91 further comprises a circuit layer 93 having a pattern of circuit lines made of a superconducting thin film and deposited on the first surface 92a of the dielectric substrate 92. The superconducting thin film is made of a ceramics system, such as a YBaCuO system, of the HTS.

The filter 91 comprises a ground layer, not shown in the drawings, consisting of a superconducting thin film layer and a metal layer. The superconducting thin film layer of the ground layer is made of a YBaCuO system of the HTS and deposited on the second surface 92b of the dielectric substrate 92. The metal layer of the ground layer is deposited on the superconducting thin film layer of the ground layer.

The conventional mounting structure 90 as shown in FIGS. 14 and 15 comprises a device holder 94, a plurality of fastening parts 95, input and output connectors 96a and 96b, and an adhesive layer 97.

The device holder 94 has a base surface 94a and is adapted to hold the filter 91 thereon. The device holder 94 is grounded where the base surface 94a of the device holder 94 and the ground layer of the filter 91 are electrically connected with each other. As shown in FIG. 15, the base surface 94a is formed on an upper side surface of the device holder 94 into a smoothed flat plane. The base surface 94a of the device holder 94 is made of a conductive material selected from among the group consisting of copper and aluminum and covered with a nickel and gold.

The input connector 96a is electrically connected to the filter 91 and the first external device through the input connector 5 shown in FIG. 13 to allow the signal to be inputted from the first external device to the filter 91. The output connector 96b is electrically connected to the filter 91 and the second external device through the output connector 6 shown in FIG. 13 to allow the signal to be outputted from the filter 91 to the second external device. The filter 91 can thus transmit the signal from and to the first and second external devices outside of the device holding apparatus 1.

The adhesive layer 97 intervenes between the ground layer of the filter 91 and the device holder 94. The adhesive layer 97 has a first surface 97a facing the ground layer of the filter 91 and a second surface 97b facing the base surface 94a of the device holder 94. In this example, the adhesive layer 97 is made of an indium foil covering a whole area of the ground layer of the filter 91 therewith.

The fastening parts 95 are operated to fasten the filter 91 on the device holder 94, so that the first surface 97a of the adhesive layer 97 can be held in contact with the ground layer of the filter 91 and the second surface 97b of the adhesive layer 97 can be also held in contact with the base surface 94a of the device holder 94. Each of the fastening parts 95 includes a pressing member 95a and a clamp screw 95b screwed into the device holder 94 to secure the pressing member 95a to the device holder 94.

As shown in FIG. 14, the filter 91 has a circuit portion on which there is the circuit layer 93 and a peripheral portion on which there is no circuit layer. In this example, the fastening parts 95 are arranged along the peripheral portion of the device holder 94 at eight points to secure the filter 91 at its peripheral portion on the device holder 94 as shown in FIG. 14.

Two of the eight points are especially positioned at the places adjacent to the input and output connectors 96a and 96b in order to ensure that the input and output of the filter 91 are securely grounded. Other than the above two points are spaced apart from each other at predetermined intervals in order to prevent the signal in a high frequency from leaking from the ground layer of the filter 91. From this point of view, each of intervals of these positions may be assumed to be equal to or less than a half wavelength $\lambda/2$ of the band-pass frequency of the filter 91. In this example, the filter 91 has the half wavelength $\lambda/2$ of 150 mm as the band-pass frequency is about 1 GHz. Therefore, the fastening parts 95 may be spaced apart from each other at the intervals of 150 mm or less.

Referring to FIG. 16 of the drawings, there is shown a graph showing a filter function in a frequency response of a typical filter including the above filter 91. As shown in FIG. 16, the typical filter has a large response within a passband. The frequency response of the filter is attenuated outside of the passband, more specifically in a frequency region outside of a region between $f_L$ and $f_H$ as shown in FIG. 16. The typical filter has a filter function in frequency response generally defined as attenuation "A" outside of the passband of 90 dB or more. Likewise, the HTS device may preferably have a filter function in frequency response defined as the attenuation A outside of the passband of 90 dB or more.

In the conventional mounting structure 90, the adhesive layer 97 can be made of an indium, which is inexpensive. The indium has a specific resistance $\rho$ of 8.8 $\mu\Omega$·cm and a modulus of elasticity of $1.57\times10^6$ psi.

The above adhesive layer 97 is, however, liable to seal a gas in a boundary between the first surface 97b of the adhesive layer 97 and the ground layer of the filter 91 and a boundary between the second surface 97b of the adhesive layer 97 and the base surface 94a of the device holder 94, owing to the extremely low modulus of elasticity of the indium. The sealed gas in the aforesaid boundaries is gradually released, thereby making it impossible to keep the specific low pressure of $2\times10^{-2}$ Pa in the closed vacuum chamber and the specific low temperature of 80 K.

In order to solve the above problem in the conventional mounting structure 90, the closed vacuum chamber is conventionally being pumped down to a low pressure of lower than $2\times10^{-2}$ Pa by a vacuum pump (not shown) while the device 4 is being operated in the closed vacuum chamber. Therefore, the gas can be pumped out even when the gas sealed in the boundaries is released while the device is operated in the closed vacuum chamber.

Recently, the device holding apparatus 1 must be reduced in size. Moreover, the vacuum pump must be removed after housing the superconductor device 4 and pre-pumping the gas out from the device holding apparatus 1. It is impossible to pump down the closed vacuum chamber while superconductor device 4 is being operated. Therefore, the sealed gas cannot be pumped out even when the sealed gas is released from the boundaries to the vacuum chamber.

In order to keep a low pressure of $2\times10^{-2}$ Pa, the amount of the gas released from the boundaries should be limited to $1\times10^{-9}$ Pa·m³/sec or less, which is the same amount of the gas released from a chamber wall of the housing 2. The gas sealed in the boundaries is, however, apt to be gradually released to have the amount of the released gas exceed this limitation of $1\times10^{-9}$ Pa·m³/sec, thereby making it impossible to keep the specific low pressure of $2\times10^{-2}$ Pa while the device is being operated in the conventional mounting structure 90. This causes a problem for the operation of the superconductor device.

Furthermore, the superconductor device such as a filter is required to have a high conductivity because the ground layer of the superconductor device has an extremely low contact resistance against the base surface 94a of the device holder 94. The conventional mounting structure 90 however cannot establish a high conductivity because the adhesive layer 97 is made of the indium which has a low conductivity, i.e., the specific resistance $\rho$ of 8.8 $\mu\Omega$·cm.

SUMMARY OF THE INVENTION

It is an object of the present invention to provide a mounting structure for a superconductor device, more particularly, for a high temperature superconductor device, which is used under a specific condition such as at a low temperature of 80 K or less and a low pressure of $2\times10^{-2}$ Pa or less in a closed vacuum chamber.

It is another object of the present invention to provide a mounting structure for a superconductor device, more particularly, for a high temperature superconductor device such as a filter having a filter function defined as an attenuation A of 90 dB or more. Furthermore, the mounting structure is adaptable for the superconductor device having a ground layer which should be securely grounded enough to have an extremely low contact resistance. Moreover, the mounting structure can have the amount of the released gas restricted.

In accordance with a first aspect of the present invention, there is provided a mounting structure for a superconductor device. The superconductor device is adapted to have a signal inputted from a first external device and to output a signal to a second external device. The superconductor device comprises: a dielectric substrate having first and second surfaces; a circuit layer made of a superconducting thin film and deposited on the first surface of the dielectric substrate to allow the inputted signal to pass therethrough; and a ground layer made of a conductive material and deposited on the second surface of the dielectric substrate.

The mounting structure comprises: a device holder having a base surface and adapted to hold the superconductor device thereon; and a conductive layer intervening between the ground layer of the superconductor device and the device holder, and having a first surface facing the ground layer of the superconductor device and a second surface facing the base surface of the device holder. The base surface of the device holder and the ground layer of the superconductor device are electrically connected with each other through the conductive layer. The mounting structure further comprises an input connector electrically connected to the superconductor device and the first external device to allow the signal to be inputted from the first external device to the superconductor device; an output connector electrically connected to the superconductor device and the second external device to allow the signal to be outputted from the superconductor device to the second external device; and fastening means for resiliently fastening the superconductor device to the device holder to have the first surface of the conductive layer held in press contact with the ground layer of the superconductor device and to have the second surface of the conductive layer held in press contact with the base surface of the device holder to ensure that the ground layer of the superconductor device is electrically connect to the device holder through the conductive layer.

In the mounting structure, the conductive layer may have a plurality of contact areas each partially covering an area of the dielectric substrate. The fastening means may comprise a plurality of plate springs each positioned at each of the contact areas of the conductive layer to have the first surface of conductive layer held in press contact with the ground layer of the superconductor device and to have the second surface of conductive layer held in press contact with the base surface of the device holder to ensure that the ground layer of the superconductor device is electrically connect to the device holder through each of the contact areas of the conductive layer.

In the aforesaid mounting structure, the superconductor device may have a circuit portion on which there is the circuit layer and a peripheral portion on which there is no circuit layer. The contact areas of the conductive layer are arranged along the peripheral portion of the superconductor device.

Alternatively, the superconductor device may have a circuit portion on which there is the circuit layer and a central portion on which there is no circuit layer. The contact areas of the conductive layer may be arranged on the center portion of the superconductor device.

In the mounting structure, the superconductor device may have a central portion at which the superconductor device is soldered to fix to the base surface of the device holder.

In the mounting structure, the conductive layer may be integrated with the ground layer of the superconductor device. The conductive layer may be integrated with the base surface of the device holder.

In the mounting structure, the superconducting thin film layer may be made of a high temperature superconducting material. The conductive layer may be made of a metal selected from among the group consisting of gold, silver, copper, aluminum and an alloy made of at least one of gold, silver, copper and aluminum. The conductive layer may be made of a material having a specific resistance $\rho$ less than 3 $\mu\Omega\cdot$cm. The conductive layer may be made of a material having a modulus of elasticity more than $5\times10^6$ psi and less than $20\times10^6$ psi.

In the mounting structure, the conductive layer may be formed into a shape selected from among the group consisting of a foil, a film, and a bump. The plate springs may be operated to exert a predetermined contact pressure ranging between 0.05 and 5 kg/cm$^2$ on the corresponding contact areas of the conductive layer.

BRIEF DESCRIPTION OF THE DRAWINGS

The present invention and many of the advantages thereof will be better understood from the following detailed description when considered in connection with the accompanying drawings, wherein.

DESCRIPTION OF THE PREFERRED EMBODIMENTS

Figure 1:
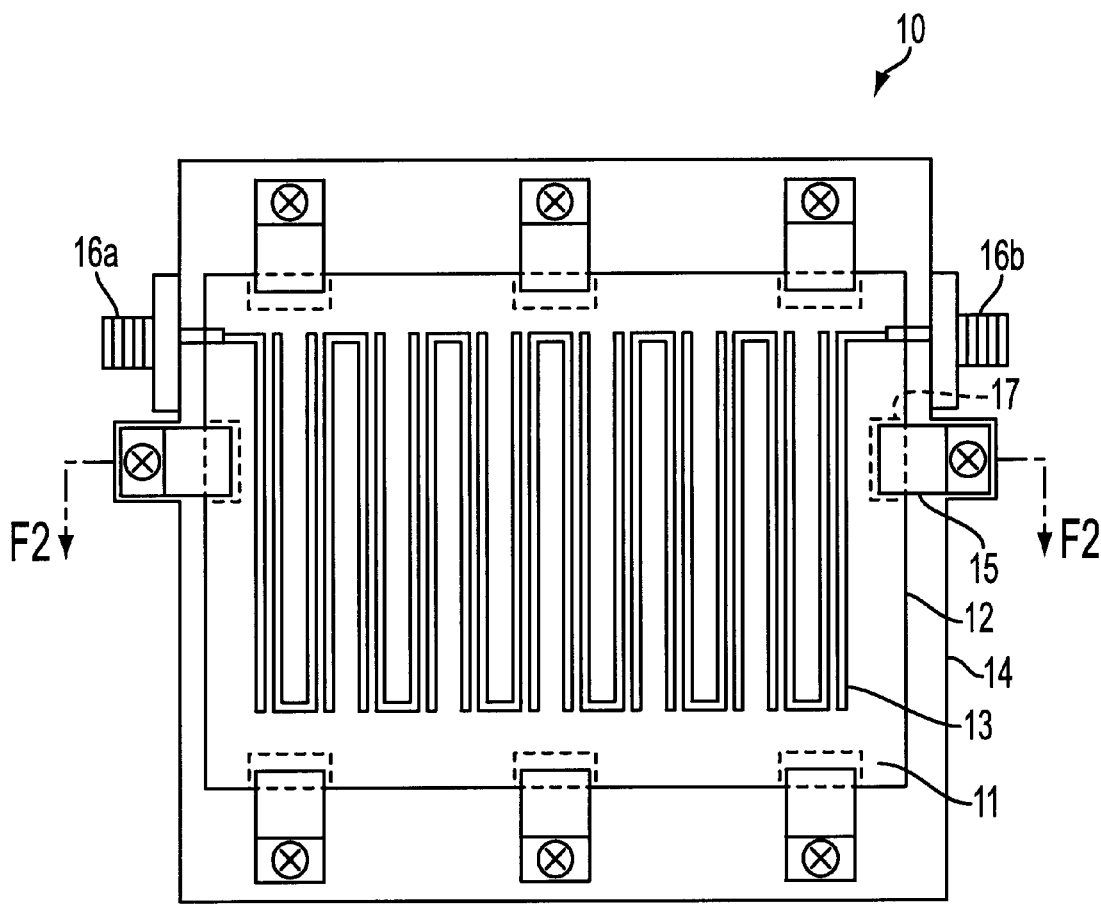
FIG. 1 is a plane view of a first preferred embodiment of a mounting structure for a superconductor device according to the present invention.

Throughout the following detailed description, similar reference characters refer to similar elements in all figures of the drawings.

Referring now to FIGS. 1 to 4 of the drawings, there is shown a first preferred embodiment of a mounting structure 10 for a superconductor device according to the present invention. The mounting structure 10 is contained in the device holding apparatus 1 shown in FIG. 13, when the superconductor device 4 is operated under the specific condition, i.e., at the pressure of $2\times10^{-2}$ Pa or less in the closed vacuum chamber shown in FIG. 13 and at the temperature of 80 K or less.

Figure 2:
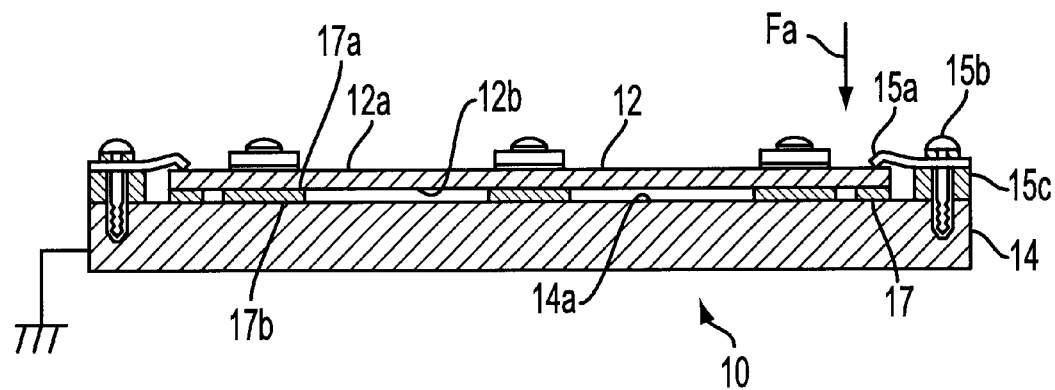
FIG. 2 is a fragmental cross sectional view taken substantially on line F2—F2 of FIG. 1.

In this embodiment, the superconductor device 4 is a planer band-pass filter 11. The filter 11 is adapted to have a signal inputted from a first external device (not shown in the drawings) to output a second external device (not shown). The filter 11 should have a filter function in frequency response defined as the attenuation A of 90 dB or more. As shown in FIGS. 1 and 2, the filter 11 comprises a dielectric substrate 12 having first and second surfaces 12a and 12b diametrically opposite to each other and a circuit layer 13. The circuit layer 13 has a pattern of circuit lines made of a superconducting thin film and is deposited on the first surface 12a of the dielectric substrate 12 to allow the inputted signal to pass therethrough. The first surface 12a of the dielectric substrate 12 is shown in FIG. 2 as being an upper side surface, while the second surface 12b of the dielectric substrate 12 is shown in FIG. 2 as being a lower side surface.

The dielectric substrate 12 is made of a MgO and shaped into a rectangular plate having a length of 60 mm, a width of 50 mm and a thickness of 0.5 mm. The superconducting thin film is made of a YBaCuO system of the HTS and deposited on the first surface 12a of the dielectric substrate 12. The superconducting thin film has a thickness of 500 nm.

The filter 11 comprises a ground layer, not shown in the drawings, consisting of a superconducting thin film layer and a metal layer. The superconducting thin film layer of the ground layer is made of a YBaCuO system of the HTS and deposited on the second surface 12b of the dielectric substrate 12. The superconducting thin film layer of the ground layer has also a thickness of 500 nm.

The metal layer of the ground layer is made of a conductive material and deposited on the superconducting thin film layer of the ground layer. The conductive material may be a gold which is evaporated and covered therewith over the superconducting thin film layer of the ground layer. The metal layer of the ground layer has a thickness of 500 nm.

In this embodiment, the band-pass filter 11 has a passband region in frequency between 824 and 849 MHz. The band-pass filter 11 is designed to have a filter function in frequency response which is defined as the attenuation A outside of the passband, i.e., in the frequency region less than 750 MHz and more than 920 MHz, of 120 dB or more.

The mounting structure 10 according to the present invention comprises a device holder 14, a plurality of fastening parts 15, input and output connectors 16a and 16b, and a conductive layer 17 as shown in FIGS. 1 and 2. The mounting structure 10 further comprises a filter case, not shown in FIGS. 1 and 2, for covering the filter 11 therewith to exclude the influence of electromagnetic wave.

The device holder 14 has a base surface 14a and is adapted to hold the filter 11 thereon. The device holder 14 is grounded where the filter 11 is electrically connected to the base surface 14a of the device holder 14 through the conductive layer 17. As shown in FIG. 2, the base surface 14a is formed on an upper side surface of the device holder 14 into a smoothed flat plane. The device holder 14 is made of a conductive material selected from among the group consisting of copper and aluminum. The device holder 14 is covered with a nickel and gold to form the base surface 14a. In this embodiment, the device holder 14 has a length of 64 mm, a width of 68 mm and a height of 23 mm.

Figure 13:
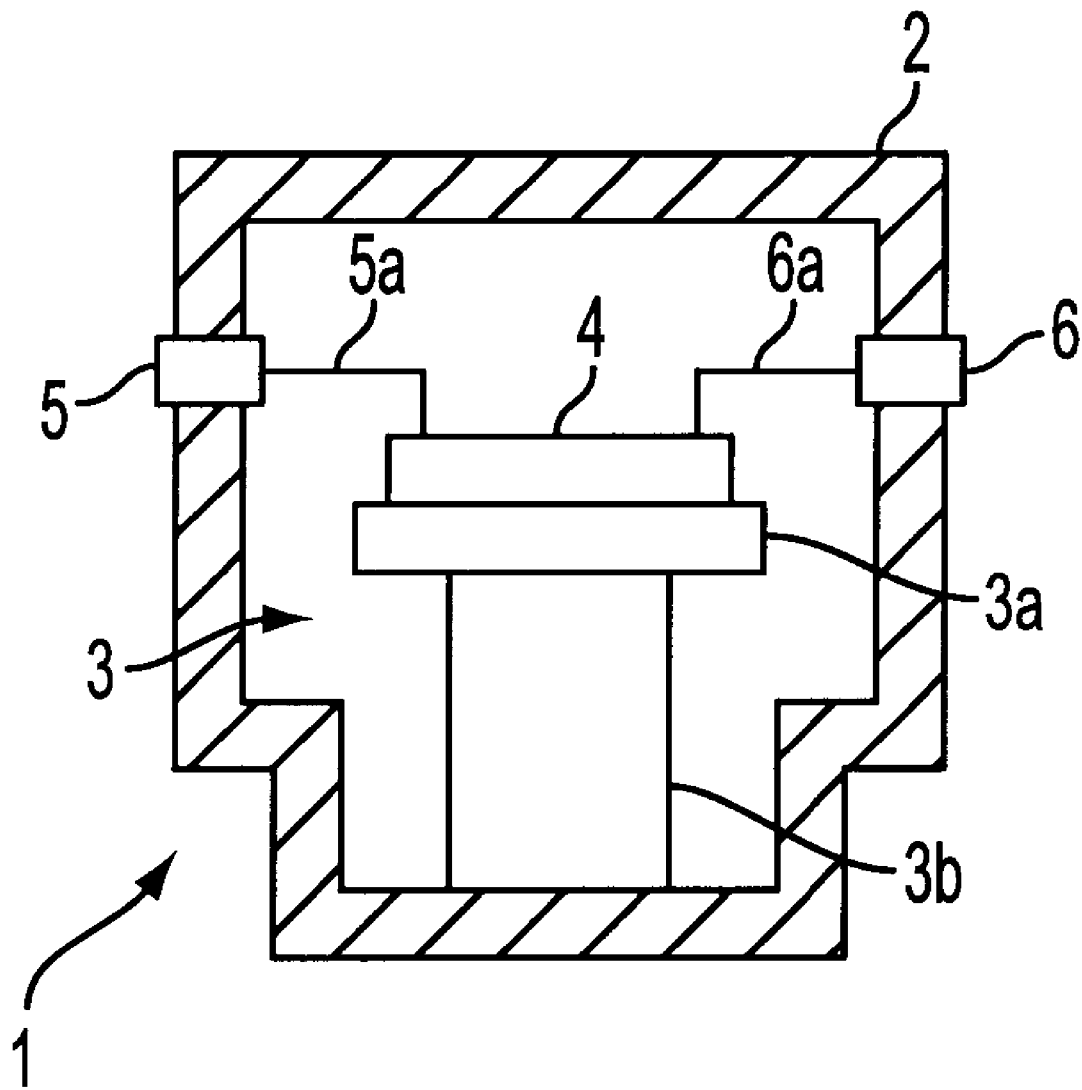
FIG. 13 is a fragmental cross sectional view of a superconductor device holding apparatus in a closed vacuum chamber.
Figure 14:
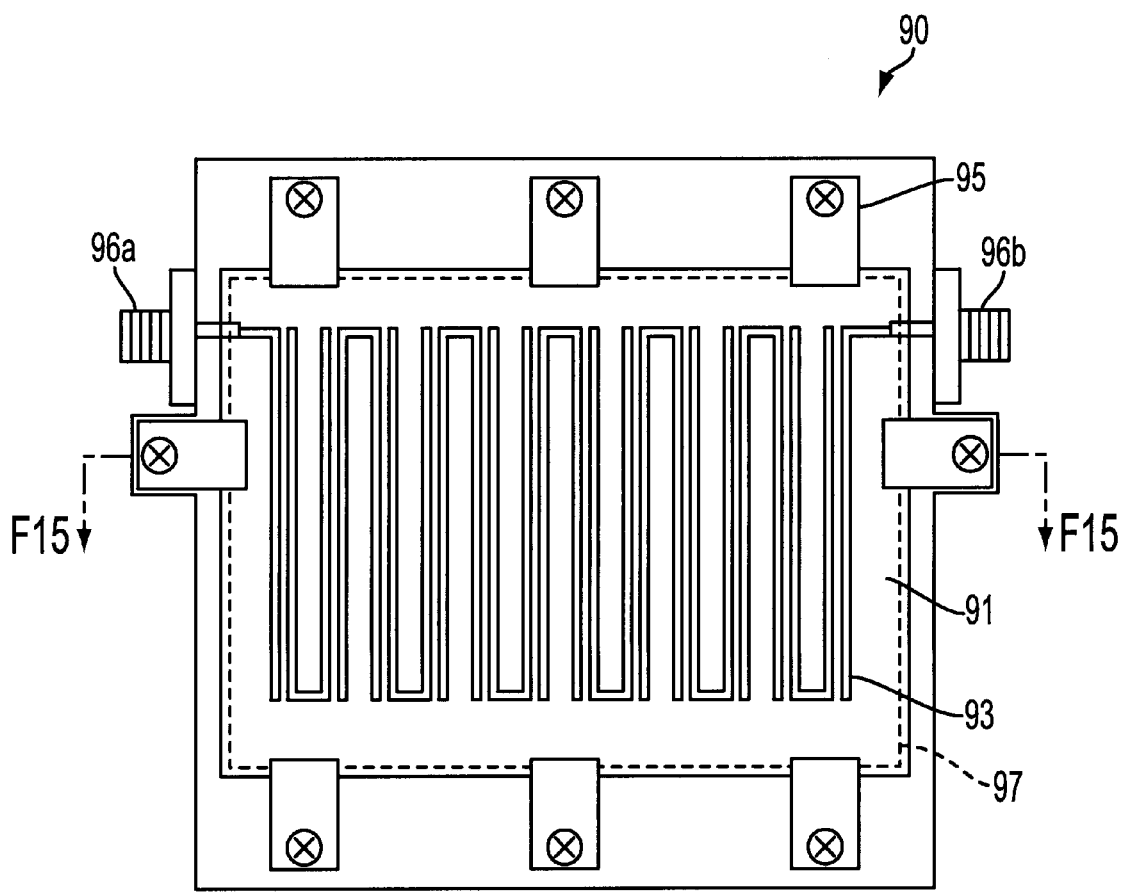
FIG. 14 is a plane view of the conventional mounting structure for the superconductor device.
Figure 15:
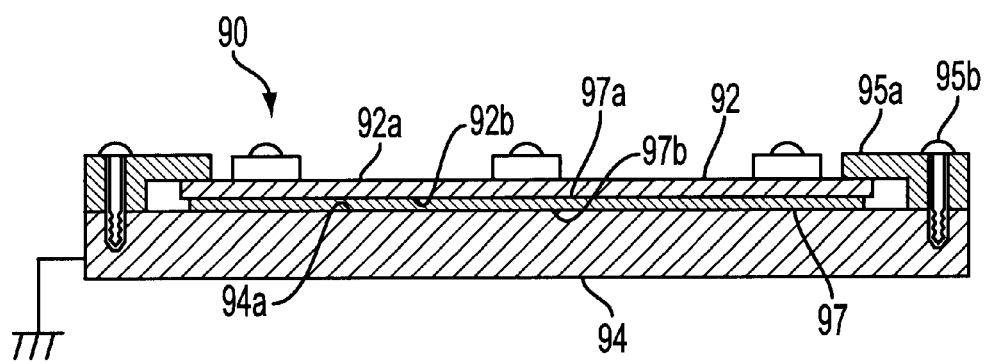
FIG. 15 is a fragmental cross sectional view taken substantially on line F15—F15 of FIG. 14.
Figure 16:
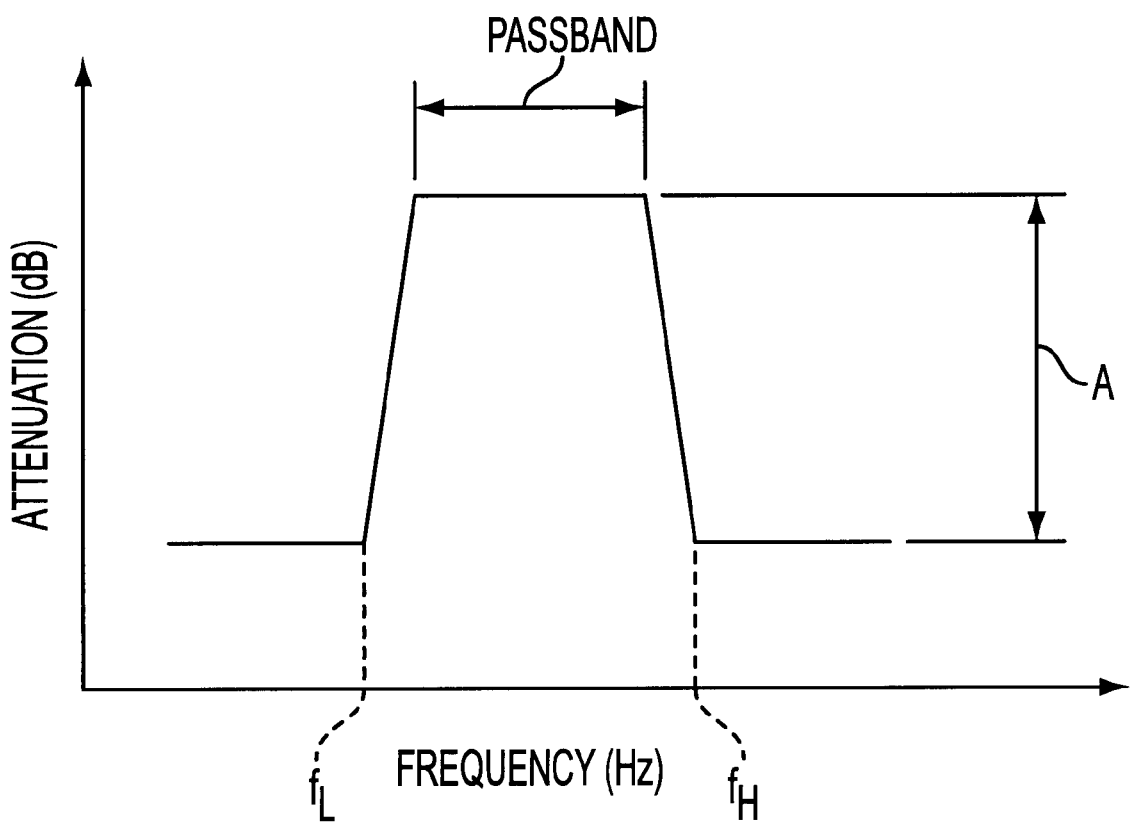
FIG. 16 is a graph showing a filter function in frequency response of a typical filter.

The input connector 16a is electrically connected to the filter 11 and the first external device through the input connector 5 shown in FIG. 13 to allow the signal to be inputted from the first external device to the filter 11. The output connector 16b is electrically connected to the filter 11 and the second external device through the output connector 6 shown in FIG. 13 to allow the signal to be outputted from the filter 11 to the second external device. The filter 11 can thus transmit the signal from and to the first and second external devices outside of the device holding apparatus 1.

The conductive layer 17 intervenes between the ground layer of the filter 11 and the device holder 14. In this embodiment, the conductive layer 17 has a plurality of contact areas each partially covering an area of the dielectric substrate 12. Each of the contact areas of the conductive layer 17 has a length of 5 mm, a width of 2 mm and a thickness of 50 $\mu$m. The conductive layer 17 has a first surface 17a facing the ground layer of the filter 11 and a second surface 17b facing the base surface 14a of the device holder 14.

The fastening parts 15 are adapted to resiliently fasten the filter 11 to the device holder 14 to exert a predetermined pressing force Fa on the filter 11, so that the first surface 17a of the conductive layer 17 can be held in press contact with the ground layer of the filter 11 and the second surface 17b of the conductive layer 17 can be also held in press contact with the base surface 14a of the device holder 14. This results in the fact that the ground layer of the filter 11 can be electrically connected to the device holder 14 through the conductive layer 17. Each of the fastening parts 15 includes a plate spring 15a, a clamp screw 15b and a spacer 15c. The clamp screw 15b is screwed into the device holder 14 to secure the plate spring 15a to the device holder 14 through the spacer 15c. The spacer 15c has a predetermined height as same as that of the first surface 12a of the dielectric substrate 12, when the dielectric substrate 12 is placed on the device holder 14.

In this embodiment, the filter 11 has a circuit portion on which there is the circuit layer 13 and a peripheral portion on which there is no circuit layer. The contact areas of the conductive layer 17 are arranged along the peripheral portion of the filter 11. Therefore, the fastening parts 15 are arranged along the peripheral portion of the device holder 14 at eight points at the same places of the contact areas of the conductive layer 17 as shown in FIG. 1. Therefore, the ground layer of the filter 11 can be electrically connected to the device holder 14 through each of the contact areas of the conductive layer 17. Two of the eight points are especially placed at the places adjacent to the input and output connectors 16a and 16b in order to ensure that the input and output of the filter 11 are securely grounded. Other than the above two points are spaced apart from each other at predetermined intervals in order to prevent the signal in a high frequency from leaking from the ground layer of the filter 11. The ground layer of the filter 11 can be, therefore, securely grounded enough to have an extremely low contact resistance.

Figure 3:
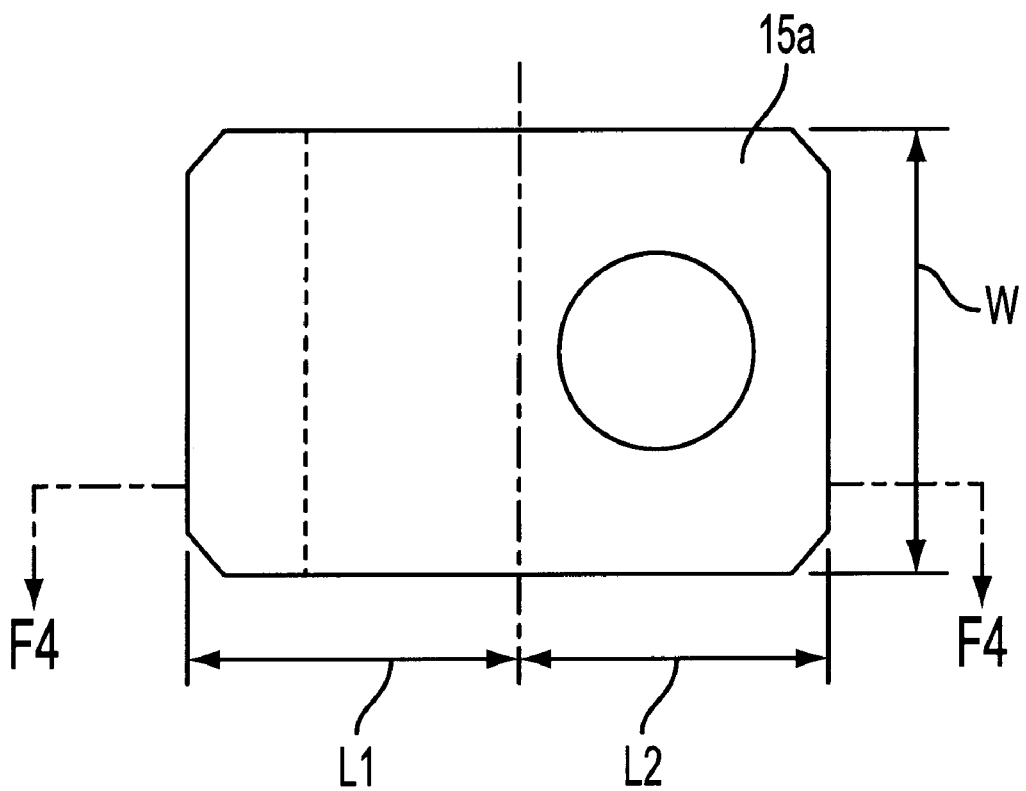
FIG. 3 is an enlarged plane view of the plate spring shown in FIG. 1.
Figure 4:
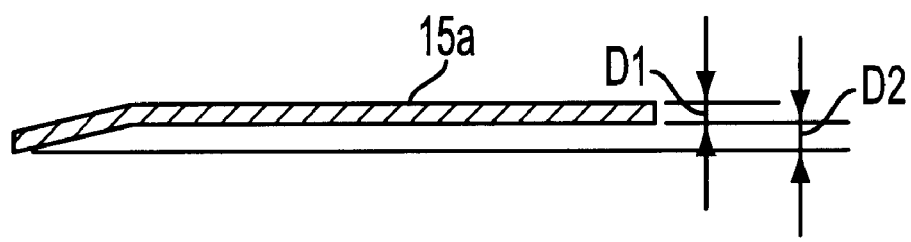
FIG. 4 is a cross sectional view taken substantially on line F4—F4 of FIG. 3.

More specifically, one of the plate springs 15a is shown in FIGS. 3 and 4. The plate spring 15a has a spring portion L1 and a fixing portion L2. The spring portion has one end exert the pressing force Fa on the dielectric substrate 12. The fixing portion has a hole through which the clamp screw 15b is screwed to secure the spring plate 15 to the device holder 14. The plate spring 15a has a length of 6.4 mm (L1 b=3.2 mm), a width (w) of 4.0 mm and a thickness (D1) of 0.15 mm. The displacement (D2) of the spring is 0.2 mm. The pressing force Fa exerted on the dielectric substrate 12 by each of the fastening parts 15 is in proportion to the width w of the plate spring 15a and also in proportion to the cube of the thickness D1 of the plate spring 15a. Moreover, the contact pressure can be determined on the basis of the relationship between the pressing force Fa and the area of each contact area of the conductive layer 17. Therefore, the fastening part 15 may be designed for a desired contact pressure by adjusting the width w and the thickness D1 of the plate spring 15a with respect to the area of each contact area of the conductive layer 17. Each of the plate springs 15a thus constructed has a pressing force Fa of 0.1 kg and is capable of loading the contact pressure of 1 kg/cm$^2$ onto each of contact areas of the conductive layer 17 which has a length of 5 mm and a width of 2 mm.

The conductive layer 17 is made of a material having a specific resistance $\rho$ less than 3 $\mu\Omega$·cm and a modulus of elasticity more than $5\times10^6$ psi and less than $20\times10^6$ psi, for example, a metal selected from among the group consisting of gold, silver, copper, aluminum and an alloy made of at least one of gold, silver, copper and aluminum.

The conductive layer 17 may be formed into a shape selected from among the group consisting of a foil, a film, and a bump. The fastening parts 15 are operated to exert the pressing force Fa to have the filter 11 held in press contact with the device holder 14 at the contact pressure ranging between 0.05 and 5 kg/cm$^2$ on the corresponding contact areas of the conductive layer 17.

EXAMPLE

It will be described hereinlater that results of measurement of the filter function of the above filter 11 in the mounting structure 10 shown in FIGS. 1 and 2 with reference to the following Table 1. The measurement was performed after the preparation having the steps as follows:

(a) mounting the filter 11 on the device holder 14 by way of the conductive layer 17 at a room temperature of 300 K and a pressure of $1\times10^5$ Pa;

(b) securing the filter 11 to the device holder 14 with the fastening parts 15;

(c) housing the filter 11 in the vacuum chamber of the housing 2;

(d) evacuating an air from the vacuum chamber to have the pressure held at a pressure of $2\times10^{-2}$ Pa or less;

(e) closing the vacuum chamber and removing the vacuum pump from the device holding apparatus 1; and (f) cooling the filter 11 at a temperature of 80 K or less.

In the mounting structure 10, the filter function of the filter 11 and the amount of the released gas were measured, when the filter 11 was fastened by the fastening parts 15 at the contact pressures of 0.01, 0.05, 0.5, 5.0 and 20.0 kg/cm². The attenuation A and the quantity, "Q" of the released gas were measured at each of the above contact pressures in accordance with a following equation (1):

$$Q(Pa \cdot m^3/sec) = (P_t - P_0) \cdot V/t \quad (1)$$

wherein: V is a volume (m³) of the vacuum chamber which is 0.005 m³; $P_0$ is a pressure which was measured when the steps (a) to (c) were bypassed and after the steps (d) to (f) were performed; and $P_t$ is a pressure which was measured after performing the steps (a) to (f) and then after passing a time t of 50 hours.

There are shown in Table 1 results of the measurement as follows:

TABLE 1

| Contact pressure (kg/cm²) | 0.01 | 0.05 | 0.5 | 5.0 | 20.0 |
|---|---|---|---|---|---|
| Attenuation A (dB) | 80 | 90 | 100 | 110 | 120 |
| Released Gas Q (Pa · m³/sec) | $3 \times 10^{-10}$ | $4 \times 10^{-10}$ | $6 \times 10^{-10}$ | $8 \times 10^{-10}$ | $6 \times 10^{-8}$ |

It will be appreciated from the above results that the mounting structure 10 according to the present invention can ensure that the released gas is restricted within $1\times10^{-9}$ Pa·m³/sec and the attenuation A is 90 dB or more when the contact pressure is defined between 0.05 and 5.0 kg/cm². Therefore, the mounting structure 10 according to the present invention can adjust the contact pressure ranging between 0.05 and 5.0 kg/cm² enough to stably ground the filter 11.

Control

In order to evaluate the mounting structure according to the present invention, the above conductive layer 17 which is made of gold is replaced with the adhesive layer which is made of an indium foil. It will be appreciated that the present invention is superior to the control. The condition of the measurement of the control is the same as that of the measurement of the example as described above with reference to Table 1.

There are shown in Table 2 results of the measurement of the control as follows:

TABLE 2

| Contact Pressure (kg/cm²) | 0.01 | 0.05 | 0.5 | 5.0 | 20.0 |
|---|---|---|---|---|---|
| Attenuation A (dB) | 60 | 65 | 70 | 90 | 100 |
| Released Gas Q (Pa · m³/sec) | $9 \times 10^{-10}$ | $1 \times 10^{-9}$ | $5 \times 10^{-9}$ | $7 \times 10^{-8}$ | $5 \times 10^{-7}$ |

It is noted from the above Table 2 that the filter 11, which uses the adhesive layer, should be fastened by the fastening parts 15 at the contact pressure of 5.0 kg/cm² or more in order to have the aforesaid preferred attenuation A of 90 dB or more.

The filter 11 is generally required to have the quantity Q of the gas released therefrom reduced to $1\times10^{-9}$ Pa·m³/sec or less as described above. The quantity Q of the gas released from the filter 11, however, exceeds $1\times10^{-9}$ Pa·m³/sec when the filter 11 is fastened by the fastening parts 15 at the contact pressure of 5.0 kg/cm² or more. This means that the control of the mounting structure, in which the conductive layer 17 is replaced with the adhesive layer made of an indium foil, fails to achieve both of requirements in the attenuation A and the quantity Q of the released gas.

Accordingly, the mounting structure 10 according to the present invention can have the amount of the released gas restricted as well as the ground layer of the filter 11 can be securely grounded enough to have an extremely low contact resistance in comparison with the control.

Although the conductive layer 17 made of a gold foil is placed between the dielectric substrate 12 and the device holder 14 in the first embodiment, the conductive layer 17 may be constructed through the other processes which will be described hereinlater with reference to FIGS. 5 and 6 of the drawings.

Figure 5:
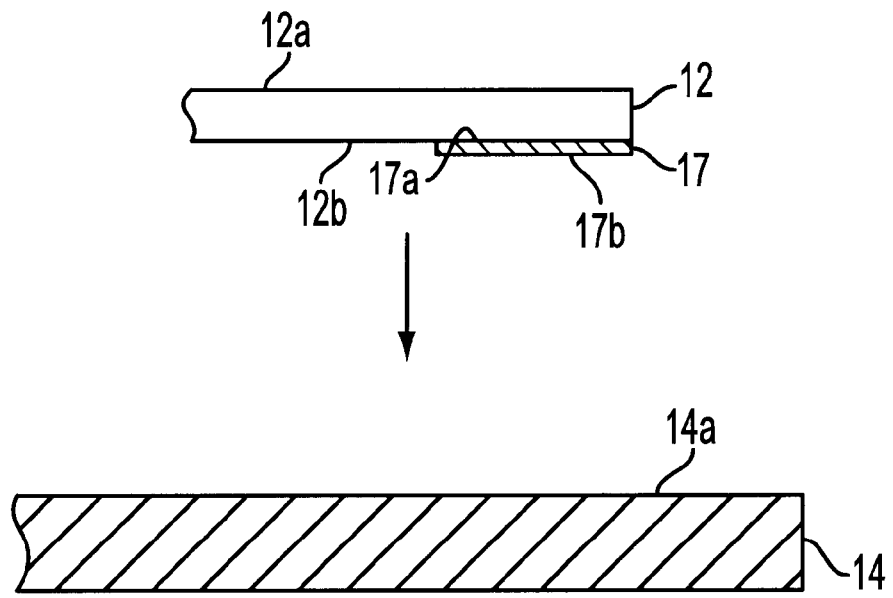
FIG. 5 is a sectional view of the conductive layer formed on the ground layer of the filter.

In one of the processes of forming the conductive layer 17, as shown in FIG. 5, the conductive layer 17 is integrated with the ground layer of the filter 11, i.e., the side of second surface 12b of the dielectric substrate 12, through a general physical vapor deposition method. Therefore, the first surface 17a of the conductive layer 17 can be held in hermetical contact with the ground layer of the filter 11 i.e., the side of the second surface 12b of the dielectric substrate 12.

Figure 6:
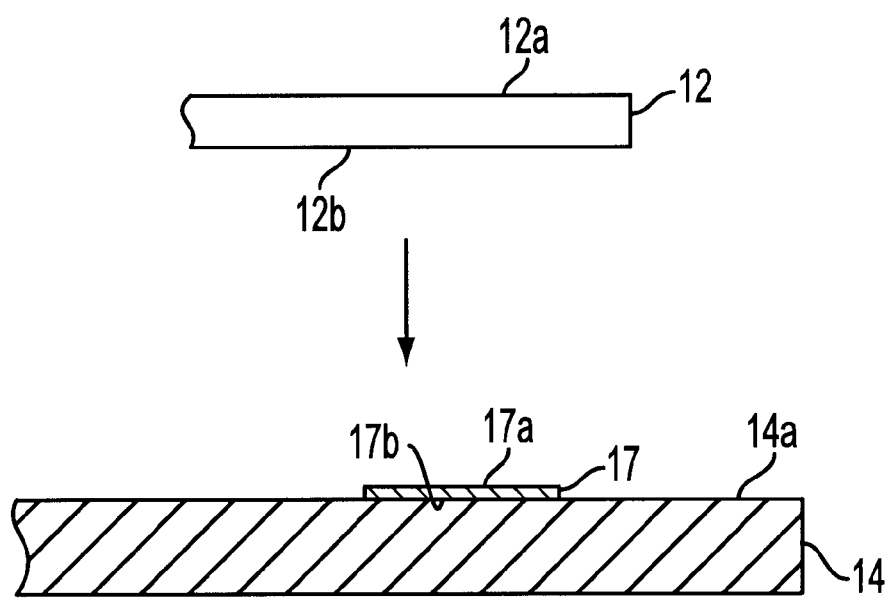
FIG. 6 is a sectional view of the conductive layer formed on the base surface of the device holder.

In the other of the processes of forming the conductive layer 17, as shown in FIG. 6, the conductive layer 17 is integrated with the base surface 14a of the device holder 14 through a general physical vapor deposition method. Therefore, the second surface 17b of the conductive layer 17 can be held in hermetical contact with the base surface 14a of the device holder 14.

Figure 7:
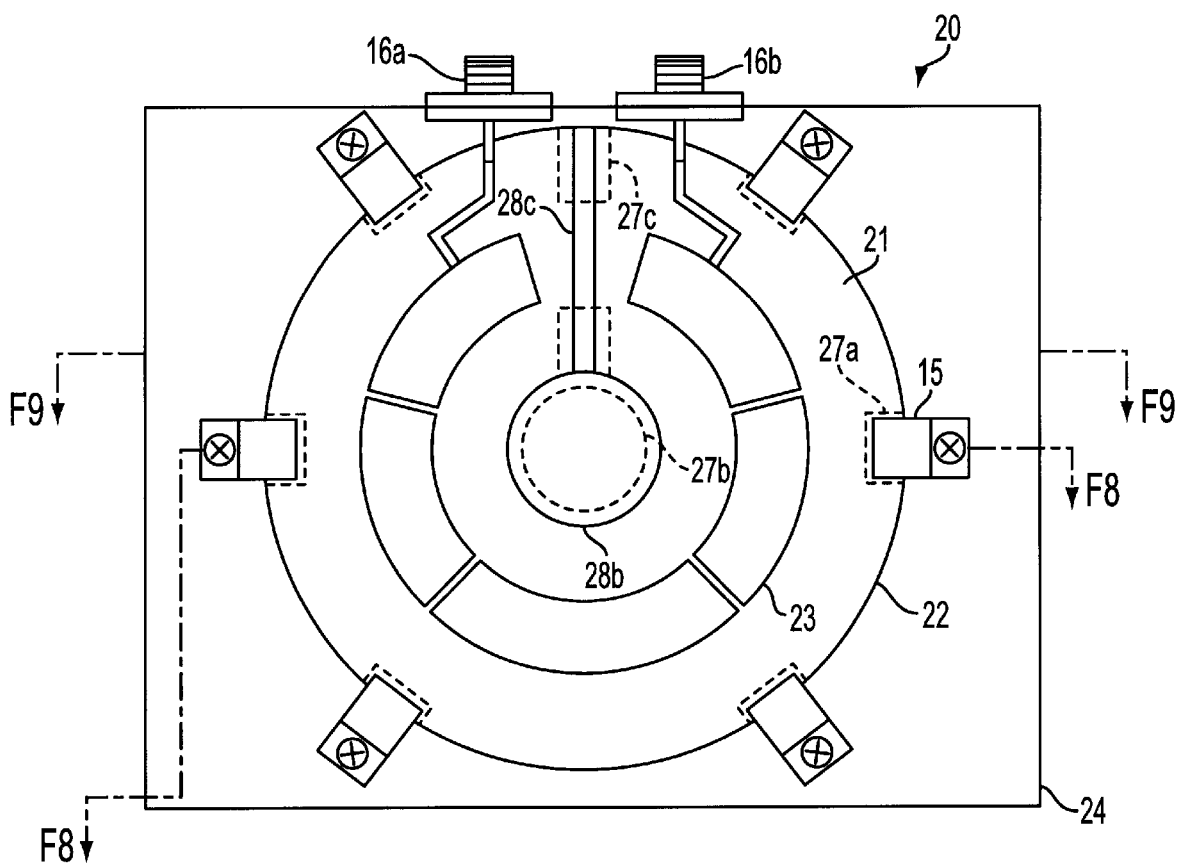
FIG. 7 is a plane view of a second preferred embodiment of the mounting structure for the superconductor device according to the present invention.
Figure 9:
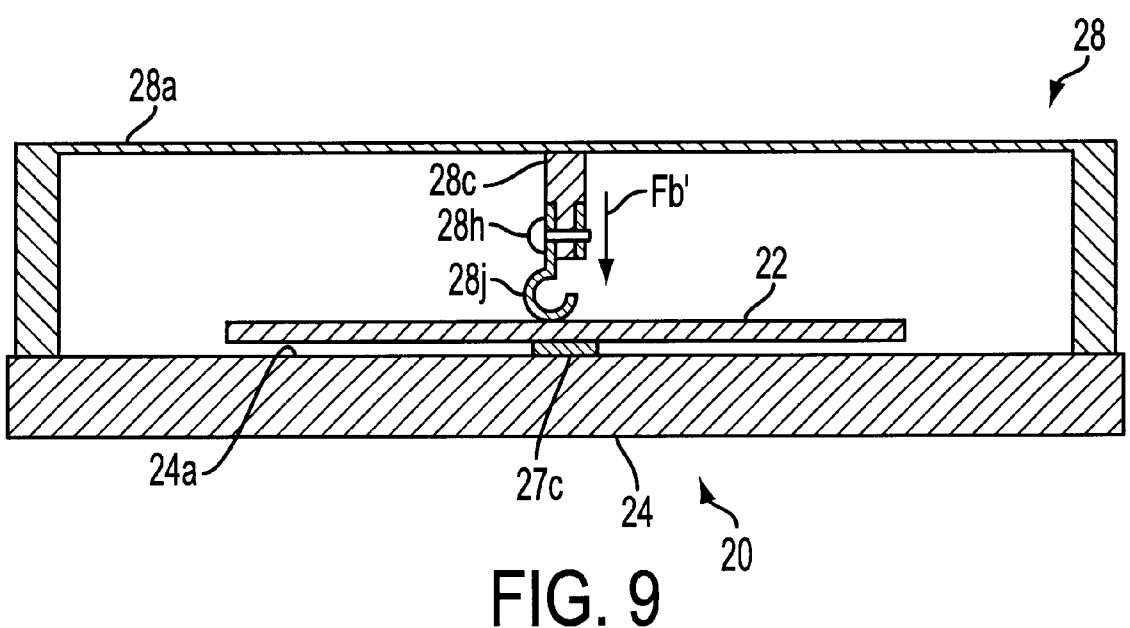
FIG. 9 is a fragmental cross sectional view taken substantially on line F9—F9 of FIG. 7.

Referring now to FIGS. 7 and 9 of the drawings, there is shown a second embodiment of the mounting structure 20 for the superconductor device according to the present invention. In this embodiment, the mounting structure 20 is adaptable for mounting a planer band-pass filter 21 and contained in the device holding apparatus 1 shown in FIG. 13, when the superconductor device 4 is operated under the specific condition, i.e., at the pressure of $2\times10^{-2}$ Pa or less in the closed vacuum chamber and at the temperature of 80 K or less.

Figure 8:
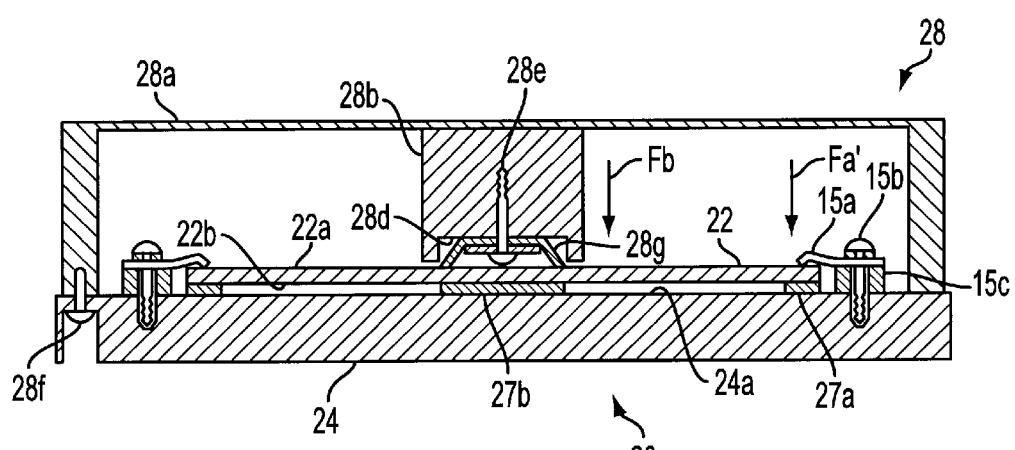
FIG. 8 is a fragmental cross sectional view taken substantially on line F8—F8 of FIG. 7.

The filter 21 is adapted to have a signal inputted from a first external device (not shown in the drawings) to output a second external device (not shown). The filter 21 should have a filter function in frequency response defined as the attenuation A of 90 dB or more. As shown in FIGS. 7 and 8, the filter 21 comprises a dielectric substrate 22 having first and second surfaces 22a and 22b diametrically opposite to each other and a circuit layer 23. The circuit layer 23 has a pattern of circuit made of a superconducting thin film on the first surface 22a of the dielectric substrate 22 to allow the inputted signal to pass therethrough. The first surface 22a of the dielectric substrate 22 is shown in FIG. 8 as being an upper side surface, while the second surface 22b of the dielectric substrate 22 is shown in FIG. 8 as being a lower side surface.

The dielectric substrate 22 is made of a MgO and shaped into a disk plate. The superconducting thin film is made of a YBaCuO system of the HTS and deposited on the first surface 22a of the dielectric substrate 22.

The filter 21 comprises a ground layer, not shown in the drawings, consisting of a superconducting thin film layer and a metal layer. The superconducting thin film layer of the ground layer is made of a YBaCuO system of the HTS and deposited on the second surface 22b of the dielectric substrate 22. The metal layer of the ground layer is made of a conductive material and deposited on the superconducting thin film layer of the ground layer. The conductive material may be a gold which is evaporated and covered therewith over the superconducting thin film layer of the ground layer.

As shown in FIGS. 7 and 8, the mounting structure 20 comprises the same constitutional element including the plurality of fastening parts 15, and the input and output connectors 16a and 16b as those of the first preferred embodiment of the mounting structure 10 shown in FIGS. 1 and 2. The mounting structure 20 further comprises a device holder 24, first, second and third conductive layers 27a, 27b and 27c, and a filter case 28.

The device holder 24 has a base surface 24a and is adapted to hold the filter 21 thereon. The device holder 24 is grounded where the filter 21 is electrically connected to the base surface 24a of the device holder 24 through the conductive layer 27. As shown in FIG. 8, the base surface 24a is formed on an upper side surface of the device holder 24 into a smoothed flat plane. The device holder 24 is made of a conductive material selected from among the group consisting of copper and aluminum. The device holder 24 is covered with a nickel and gold to form the base surface 24a.

The input connector 16a is electrically connected to the filter 21 and the first external device through the input connector 5 shown in FIG. 13 to allow the signal to be inputted from the first external device to the filter 21. The output connector 16b is electrically connected to the filter 21 and the second external device through the output connector 6 shown in FIG. 13 to allow the signal to be outputted from the filter 21 to the second external device. The filter 21 can thus transmit the signal from and to the first and second external devices outside of the device holding apparatus 1.

The first, second and third conductive layers 27a, 27b and 27c intervene between the ground layer of the filter 21 and the device holder 24. Each of the first, second and third conductive layers 27a, 27b and 27c has a first surface facing the ground layer of the filter 21 and a second surface facing the base surface 24a of the device holder 24. In this embodiment, the first conductive layer 27a has six of contact areas, while the second conductive layer 27b has a circular contact area. The third conductive layer 27c has two contact areas. Each of the contact areas of the first, second and third conductive layers 27a, 27b and 27c partially covers an area of the dielectric substrate 22.

Each of the first, second and third conductive layers 27a, 27b and 27c is made of a material having a specific resistance ρ less than 3 $\mu\Omega\cdot$cm and a modulus of elasticity more than $5\times10^6$ psi and less than $20\times10^6$ psi, for example, a metal selected from among the group consisting of gold, silver, copper, aluminum and an alloy made of at least one of gold, silver, copper and aluminum. Each of the first, second and third conductive layers 27a, 27b and 27c may be formed into a shape selected from among the group consisting of a foil, a film, and a bump.

The fastening parts 15 are adapted to resiliently fasten the filter 21 to the device holder 24 to exert a predetermined pressing force Fa on the filter 21, so that the first surface of the first conductive layer 27a can be held in press contact with the ground layer of the filter 21 and the second surface of the first conductive layer 27a can be also held in press contact with the base surface 24a of the device holder 24. This results in the fact that the ground layer of the filter 21 can be electrically connected to the device holder 24 through the first conductive layer 27a.

In this embodiment, the filter 21 has a circuit portion on which there is the circuit layer 23, a peripheral non-circuit portion on which there is no circuit layer, a central non-circuit portion on which there is also no circuit layer, and a gap non-circuit portion which is positioned between the input and output terminals of the filter 21 and on which there is also no circuit layer. The contact areas of the first conductive layer 27a are arranged along the peripheral non-circuit portion of the filter 21. The fastening parts 15 are arranged along the peripheral portion of the device holder 24 at six points at the same places of the contact areas of the first conductive layer 27a as shown in FIG. 7. The circular contact area of the second conductive layer 27b is positioned on the central non-circuit portion of the filter 21, while the contact areas of the third conductive layer 27c are arranged along the gap non-circuit portion of the filter 21.

The filter case 28 is adapted to cover the filter 21 therewith. The filter case 28 is made of a conductive material selected from among the group consisting of copper and aluminum and coated with a nickel and a gold. The filter case 28 comprises a cover member 28a, a cylindrical pressing member 28b, a separating member 28c. The cover member 28a has a plate portion extending over the filter 21 and a wall portion vertically extending from the end of the plate portion toward the device holder 24. The cover member 28 is secured to the device holder 24 by a clamp screw 28f to have the plate portion of the cover member 28a spaced apart from and in parallel relationship with the first surface 22a of the dielectric substrate 22 as well as to have the filter enclosed in the cover member 28.

The cylindrical pressing member 28b is protruded from the center of the plate portion of the cover member 28a toward the first surface 22a of the dielectric substrate 22 and formed into a cylindrical shape. The cylindrical pressing member 28b has a recess portion 28d at its end to have a plate spring 28g received therein. The cylindrical pressing member 28b has a center axis substantially perpendicular to the first surface 22a of the dielectric substrate 22.

The plate spring 28g has a circular fixing portion having a center, at which the plate spring 28g is secured to the cylindrical pressing member 28b with a clamp screw 28e, to have the center axis of the cylindrical pressing member 28b parallel with the center axis of the clamp screw 28e. The plate spring 28g further has a plurality of spring portions along its peripheral portion outwardly extending from the circular fixing portion in the radial direction of the center axis of the cylindrical pressing member 28b.

The plate spring 28g of the filter case 28 thus constructed is adaptable to resiliently fasten the filter 21 to the device holder 24 through the second conductive layer 27b to exert a predetermined pressing force Fb on the filter 21.

As shown in FIG. 9, the separating member 28c is protruded from the middle of the plate portion of the cover member 28a toward the first surface 22a of the dielectric substrate 22 of the filter 21 along the gap non-circuit portion of the filter 11. The separating member 28c has a plurality of springs 28j respective secured thereto with a clamp screw 28h at the corresponding the contact areas of the third conductive layer 27c. The springs 28j of the filter case 28 thus constructed is adaptable to resiliently fasten the filter 21 to the device holder 24 through the third conductive layer 27c to exert a predetermined pressing force Fb' on the filter 21.

This results in the fact that the fastening parts 15, the pressing member 28b, and the springs 28j are operated to exert the pressing forces Fa', Fb and Fb' to have the filter 21 held in press contact with the device holder 24 at the contact pressure ranging between 0.05 and 5 kg/cm$^2$ on the corresponding contact areas of the first, second and third conductive layers 27a, 27b and 27c, respectively. The contact pressure of each of the plate springs 15a, 28g and 28j is defined to be between 0.05 and 5 kg/cm$^2$ on the corresponding contact areas of the first, second and third conductive layers 27a, 27b and 27c. Accordingly, the mounting structure 20 according to the present invention can adjust the contact pressure ranging between 0.05 and 5 kg/cm$^2$ enough to stably ground the filter 21. As a result, the ground layer of the; filter 21 can be securely grounded enough to have an extremely low contact resistance. Moreover, the mounting structure 20 can have the amount of the released gas restricted within $1\times10^{-9}$ Pa·m$^3$/sec.

Figure 10:
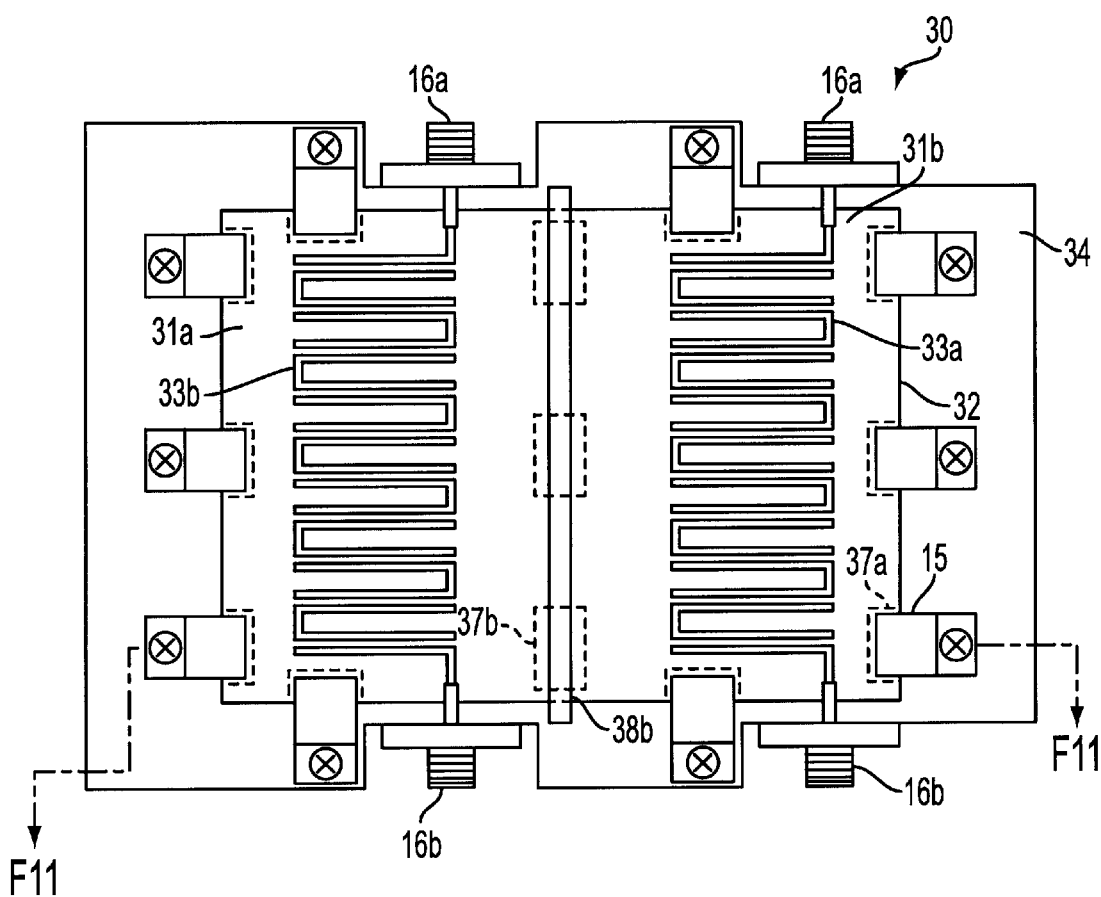
FIG. 10 is a plane view of a third preferred embodiment of the mounting structure for the superconductor device according to the present invention.
Figure 11:
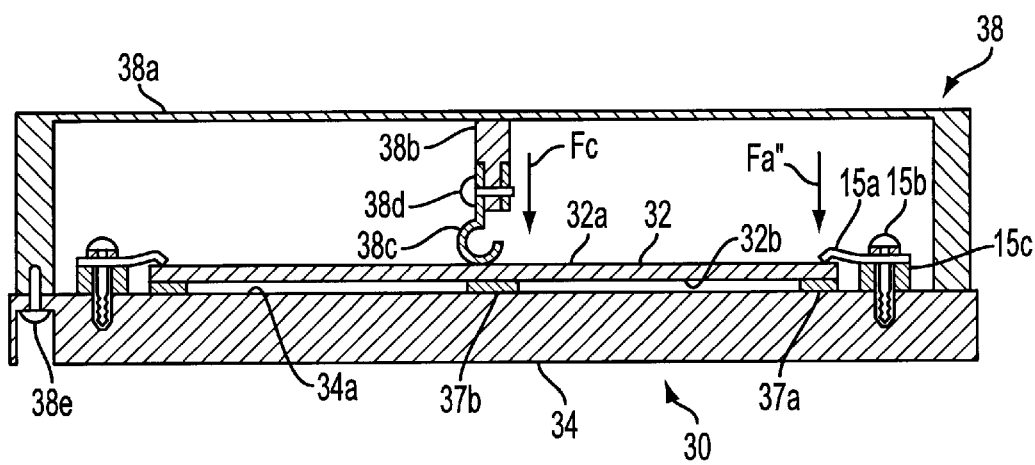
FIG. 11 is a fragmental cross sectional view taken substantially on line F11—F11 of FIG. 10.

Referring now to FIGS. 10 and 11 of the drawings, there is shown a third embodiment of the mounting structure 30 for the superconductor device according to the present invention. In this embodiment, the mounting structure 30 is adaptable for mounting a pair of planer band-pass filters 31a and 31b and contained in the device holding apparatus 1 shown in FIG. 13, when the superconductor device 4 is operated under the specific condition, i.e., at the pressure of $2\times10^{-2}$ Pa or less in a closed vacuum chamber and at the temperature of 80 K or less.

The pair of filters 31a and 31b is arranged next to each other as shown in FIGS. 10 and 11. The filters 31a and 3b are identical to each other. Therefore, the filters 31a and 31b are representatively referred to as "the filter 31" in the following description when it is unnecessary to distinguish between the filters 31a and 31b.

The filter 31 is adapted to have a signal inputted from a first external device (not shown in the drawings) to output a second external device (not shown). The filter 31 should have a filter function in frequency response defined as the attenuation A of 90 dB or more. As shown in FIGS. 10 and 11, the filter 31 comprises a dielectric substrate 32 having first and second surfaces 32a and 32b diametrically opposite to each other and a circuit layer 33. The circuit layer 33 has a pattern of circuit made of a superconducting thin film on the first surface 32a of the dielectric substrate 32 to allow the inputted signal to pass therethrough. The first surface 32a of the dielectric substrate 32 is shown in FIG. 11 as being an upper side surface, while the second surface 32b of the dielectric substrate 32 is shown in FIG. 11 as being a lower side surface.

The dielectric substrate 32 is made of a MgO and shaped into a rectangular plate. The superconducting thin film is made of a YBaCuO system of the HTS and deposited on the first surface 32a of the dielectric substrate 32.

The filter 31 comprises a ground layer, not shown in the drawings, consisting of a superconducting thin film layer and a metal layer. The superconducting thin film layer of the ground layer is made of a YBaCuO system of the HTS and deposited on the second surface 32b of the dielectric substrate 32. The metal layer of the ground layer is made of a conductive material and deposited on the superconducting thin film layer of the ground layer. The conductive material may be a gold which is evaporated and covered therewith over the superconducting thin film layer of the ground layer.

As shown in FIGS. 10 and 11, the mounting structure 30 comprises the same constitutional element including the plurality of fastening parts 15, and a pair of the input and output connectors 16a and 16b as those of the first preferred embodiment of the mounting structure 10 shown in FIGS. 1 and 2. The mounting structure 30 further comprises a device holder 34, first and second conductive layer 37a and 37b, and a filter case 38.

The device holder 34 has a base surface 34a and is adapted to hold the filter 31 thereon. The device holder 34 is grounded where the filter 31 is electrically connected to the base surface 34a of the device holder 34 through the conductive layer 37. As shown in FIG. 11, the base surface 34a is formed on an upper side surface of the device holder 34 into a smoothed flat plane. The device holder 34 is made of a conductive material selected from among the group consisting of copper and aluminum. The device holder 34 is covered with a nickel and gold to form the base surface 34a.

Each of the filters 31a and 31b is provided with the input and output connectors 16a and 16b. For example, the input connector 16a is electrically connected to the filter 31a and the first external device through the input connector 5 shown in FIG. 13 to allow the signal to be inputted from the first external device to the filter 31a. The output connector 16b is electrically connected to the filter 31a and the second external device through the output connector 6 shown in FIG. 13 to allow the signal to be outputted from the filter 31a to the second external device. The filter 31a can thus transmit the signal from and to the first and second external devices outside of the device holding apparatus 1. The filter 31b is also can transmit the signal from and to the other external devices outside of the device holding apparatus through the similar manner.

The first and second conductive layers 37a and 37b intervene between the ground layer of the filter 31 and the device holder 34. Each of the first and second conductive layers 37a and 37b has a first surface facing the ground layer of the filter 31 and a second surface facing the base surface 34a of the device holder 34. In this embodiment, the first conductive layer 37a has ten of contact areas for the filters 31a and 31b, while the second conductive layer 37b has three of contact areas as shown in FIG. 10. Each of the contact areas of the first and second conductive layers 37a and 37b partially covers an area of the dielectric substrate 32.

Each of the first and second conductive layers 37a and 37b is made of a material having a specific resistance ρ less than 3 μΩ·cm and a modulus of elasticity more than $5\times10^6$ psi and less than $20\times10^6$ psi, for example, a metal selected from among the group consisting of gold, silver, copper, aluminum and an alloy made of at least one of gold, silver, copper and aluminum. Each of the first and second conductive layers 37a and 37b may be formed into a shape selected from among the group consisting of a foil, a film, and a bump.

The fastening parts 15 are adapted to resiliently fasten the filter 31 to the device holder 34 to exert a predetermined pressing force Fa" on the filters 31, so that the first surface of the first conductive layer 37a can be held in press contact with the ground layer of the filter 31 and the second surface of the first conductive layer 37a can be also held in press contact with the base surface 34a of the device holder 34. This results in the fact that the ground layer of the filter 31 can be electrically connected to the device holder 34 through the first conductive layer 37a.

In this embodiment, the filter 31 has a circuit portion on which there is the circuit layer 33, and outside and inside peripheral portions on which there is no circuit layer. The inside peripheral portions of the filters 31a and 31b are arranged face to face with each other. The contact areas of the first conductive layer 37a are arranged along the outside peripheral portion of the filters 31a and 31b, while the contact areas of the second conductive layer 37b are arranged along the inside peripheral potions of the filters 31a and 31b. The fastening parts 15 are arranged along the peripheral portion of the device holder 34 at ten points at the same places of the contact areas of the first conductive layer 37a as shown in FIG. 10.

The filter case 38 is adapted to cover the filters 31a and 31b therewith. The filter case 38 is made of a conductive material selected from among the group consisting of copper and aluminum and coated with a nickel and a gold. The filter case 38 comprises a cover member 38a, a separating and pressing member 38b and a plurality of springs 38c. The cover member 38a has a plate portion extending over the filter 31 and a wall portion vertically extending from the end of the plate portion toward the device holder 34. The cover member 38 is secured to the device holder 34 by a clamp screw 38e to have the plate portion of the cover member 38a spaced apart from and in parallel relationship with the first surface 32a of the dielectric substrate 32 as well as to have the filter enclosed in the cover member 38.

The separating and pressing member 38b is protruded from the middle of the plate portion of the cover member 38a toward the first surfaces 32a of the dielectric substrates 32 of the filter 31 along the inside portion of the filter. The separating and pressing member 38b has the springs 38c respective secured thereto with a clamp screw 38d at the corresponding the contact areas of the second conductive layer 37b. The springs 38c of the filter case 38 thus constructed is adaptable to resiliently fasten the filter to the device holder 34 through the second conductive layer 37b to exert a predetermined pressing force Fc on the filter 31.

This results in the fact that the fastening parts 15 and the separating and pressing member 38b are operated to exert the pressing forces Fa" and Fc to have the filter 31 held in press contact with the device holder 34 at the contact pressure ranging between 0.05 and 5 kg/cm$^2$ on the corresponding contact areas of the first and second conductive layers 37a and 37b. The contact pressure of each of the plate springs 15a and 38c is defined to be between 0.05 and 5 kg/cm$^2$ on the corresponding contact areas of the first and second conductive layers 37a and 37b. Accordingly, the mounting structure 30 according to the present invention can adjust the contact pressure ranging between 0.05 and 5 kg/cm2 enough to stably ground the filter 31. As a result, the ground layer of the filter 31 can be securely grounded enough to have an extremely low contact resistance. The mounting structure 30 can have the amount of the released gas restricted within $1 \times 10^{-9}$ Pa·m$^3$/sec.

Figure 12:
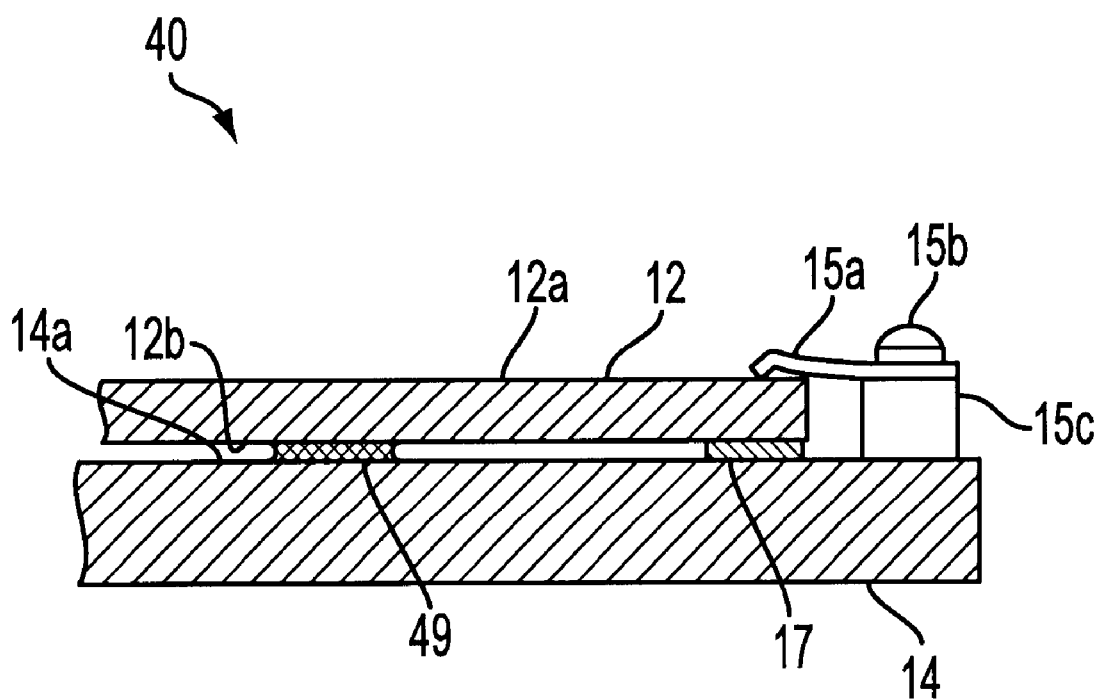
FIG. 12 is a sectional view of a fourth preferred embodiment of the mounting structure for the superconductor device according to the present invention.

Referring to FIG. 12 of the drawings, there is shown a fourth embodiment of the mounting structure 40 according to the present invention. In this embodiment, the mounting structure 40 is adapted to mount the filter 10 shown in FIG. 1. The mounting 10 structure 40 may comprise the same constitutional elements as those of the first embodiment of the mounting structure 10 shown in FIG. 1 and a soldering layer 49 partially forming between the ground layer of the filter 11 and the base surface 14a of the device holder 14 as shown in FIG. 12 at a center portion of the filter 11. The dielectric substrate 12 is welded to the middle of the base surface 14a of the device holder 14. Since the filter 11 has a circuit portion at its center portion, the fastening part 15 cannot be positioned at the center portion of the filter 11. The mounting structure 40 thus constructed can firmly secure the filter 11 to the base surface 14a of the device holder 14. As a result, the mounting structure 40 can prevent the dielectric substrate 12 from deviating from its original position even when the dielectric substrate 12 is vibrated. Therefore, the second surface 12b of the dielectric substrate 12 and the base surface 14a of the device holder 14 can be held in contact with each other through the soldering layer 49 for a long term.

The many features and advantages of the invention are apparent from the detailed specification, and thus it is intended by the appended claims to cover all such features and advantages of the invention which fall within the true spirit and scope thereof. Further, since numerous modifications and changes will readily occur to those skilled in the art, it is not desired to limit the invention to the exact construction and operation illustrated and described herein, and accordingly, all suitable modifications and equivalents may be construed as being encompassed within the scope of the invention.

What is claimed is:

1. A mounting structure for a superconductor device housed in a closed vacuum chamber, said superconductor device adapted to have a signal inputted from a first external device and to output a signal to a second external device and comprising: a dielectric substrate having first and second surfaces; a circuit layer made of a superconducting thin film and deposited on said first surface of said dielectric substrate to allow said inputted signal to pass therethrough; and a ground layer made of a conductive material and deposited on said second surface of said dielectric substrate, said mounting structure comprising:

a device holder having a base surface and adapted to hold said superconductor device thereon;

a conductive layer intervening between said ground layer of said superconductor device and said device holder, and having a first surface facing said ground layer of said superconductor device and a second surface facing said base surface of said device holder, said base surface of said device holder and said ground layer of said superconductor device electrically connected with each other through said conductive layer;

an input connector electrically connected to said superconductor device and said first external device to allow said signal to be inputted from said first external device to said superconductor device;

an output connector electrically connected to said superconductor device and said second external device to allow said signal to be outputted from said superconductor device to said second external device; and fastening means for resiliently fastening said superconductor device to said device holder to have said first surface of said conductive layer held in press contact with said ground layer of said superconductor device and to have said second surface of said conductive layer held in press contact with said base surface of said device holder to ensure that said ground layer of said superconductor device is electrically connect to said device holder through said conductive layer, wherein said fastening means comprising a plurality of plate springs each positioned at each of said contact areas of said conductive layer to have said first surface of said conductive layer held in press contact with said ground layer of said superconductor device and to have said second surface of said conductive layer held in press contact with said base surface of said device holder to ensure that said ground layer of said superconductor device is electrically connected to said device holder through each of said contact areas of said conductive layer.

2. The mounting structure as set forth in claim 1, in which said conductive layer has a plurality of contact areas each partially covering an area of said dielectric substrate.

3. A combination comprising the mounting structure as set forth in claim 2, and said superconductor device, in which said superconductor device has a circuit portion on which there is said circuit layer and a peripheral portion on which there is no circuit layer, said contact areas of said conductive layer being arranged along said peripheral portion of said superconductor device.

4. A combination comprising the mounting structure as set forth in claim 2, and said superconductor device, in which said superconductor device has a circuit portion on which there is said circuit layer and a central portion on which there is no circuit layer, said contact areas of said conductive layer being arranged on said center portion of said superconductor device.

5. The mounting structure as set forth in claim 2, in which said superconductor device has a central portion at which said superconductor device is soldered to fix to said base surface of said device holder.

6. The mounting structure as set forth in claim 2, in which said conductive layer is formed into a shape selected from among the group consisting of a foil, a film, and a bump, said plate springs operated to exert a predetermined contact pressure ranging between 0.05 and 5 $kg/cm^2$ on the corresponding contact areas of said conductive layer.

7. A combination comprising the mounting structure as set forth in claim 1, and said superconductor device, in which said conductive layer is integrated with said ground layer of said superconductor device.

8. The mounting structure as set forth in claim 1, in which said conductive layer is integrated with said base surface of said device holder.

9. A combination comprising the mounting structure as set forth in claim 1, and said superconductor device, in which said superconducting thin film layer is made of a high temperature superconducting material.

10. The mounting structure as set forth in claim 1, in which said conductive layer is made of a metal selected from among the group consisting of gold, silver, copper, aluminum and an alloy made of at least one of gold, silver, copper and aluminum.

11. The mounting structure as set forth in claim 1, in which said conductive layer is made of a material having a specific resistance $\rho$ less than 3 $\mu\Omega \cdot cm$.

12. The mounting structure as set forth in claim 1, in which said conductive layer is made of a material having a modulus of elasticity more than $5 \times 10^6$ psi and less than $20 \times 10^6$ psi.

* * * * *